United States Patent [19]

Shimoji

[11] Patent Number: 5,338,954
[45] Date of Patent: Aug. 16, 1994

[54] SEMICONDUCTOR MEMORY DEVICE HAVING AN INSULATING FILM AND A TRAP FILM JOINED IN A CHANNEL REGION

[75] Inventor: Noriyuki Shimoji, Kyoto, Japan

[73] Assignee: Rohm Co., Ltd., Kyoto, Japan

[21] Appl. No.: 12,654

[22] Filed: Feb. 3, 1993

[51] Int. Cl.⁵ .......................................... H01L 29/68
[52] U.S. Cl. .................. 257/326; 257/324; 257/316
[58] Field of Search .................. 257/324, 326, 316

[56] References Cited

U.S. PATENT DOCUMENTS 4,616,340  10/1986  Hayashi et al. .................... 257/321

FOREIGN PATENT DOCUMENTS 58-21871   2/1983  Japan .
58-194369  11/1983 Japan .................... 257/324

*Primary Examiner*—Robert Limanek
*Attorney, Agent, or Firm*—Nikaido, Marmelstein, Murray & Oram

[57] ABSTRACT

A semiconductor memory device and a method for producing the same are provided, wherein memory cells, in each of which a MONOS- or MNOS-type memory transistor is combined with an enhancement transistor in a reduced cell area, are arranged in a matrix configuration. With such a device and a method, an extremely high integration of memory cells can be realized with a reduced production cost. The semiconductor memory device of the present invention includes a gate insulating film and a trap film which are joinedly formed on a channel region of a semiconductor substrate of a first conductive type. A gate electrode extends over the two films. Source/drain regions are formed on opposite sides of the gate electrode 7 Claims, 8 Drawing Sheets

SEMICONDUCTOR MEMORY DEVICE HAVING AN INSULATING FILM AND A TRAP FILM JOINED IN A CHANNEL REGION

FIELD OF THE INVENTION

The present invention relates to a semiconductor memory device (or a semiconductor storage device) and a manufacturing method therefor. More particularly, it relates to a nonvolatile semiconductor memory device of the type wherein an insulating film traps electrons and the area of a memory cell is scaled down, and a manufacturing method for such a device.

BACKGROUND OF THE INVENTION

Nonvolatile semiconductor memory devices capable of preserving data even when they are powered OFF, such as EPROMs and EEPROMs, are roughly divided by charge storing means into two types; a flash memory type wherein hot electrons are injected into a floating gate, and a MIOS (Metal Insulator Oxide Semiconductor) type wherein electrons are injected into an insulating film utilizing a FN tunneling effect or direct tunneling effect. MIOS type memory devices include a MONOS (Metal Oxide Nitride Oxide Semiconductor) type memory device having a structure of metal-oxide film-nitride film-oxide film-semiconductor, a MNOS (Metal Nitride Oxide Semiconductor) having a structure of metal-nitride film-film oxide-semiconductor, and the like. The MIOS type memory device can be written more times by one to two figures than the flash type memory device and, hence, widely utilized.

With a memory cell of the MNOS type or MONOS type, however, if too many electrons are removed from an insulating film for trapping the electrons for erasing the data component stored in the cell, the threshold voltage would decrease too much, causing malfunction of the memory cell. In an attempt to solve this problem, there has been devised a semiconductor memory device of the composite type wherein a memory transistor of the MNOS type or MONOS type and a usual enhancement MOS transistor are formed in the same place.

Figure 13:
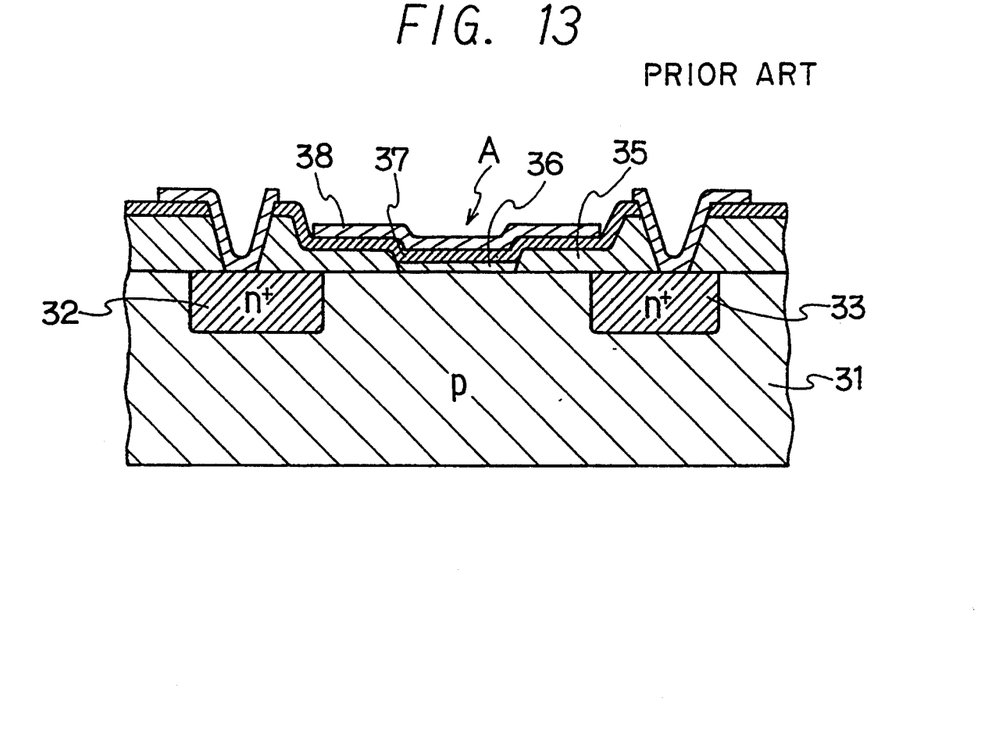
FIG. 13 is a fragmentary section showing a memory cell part of a conventional semiconductor memory device.
Figure 14:
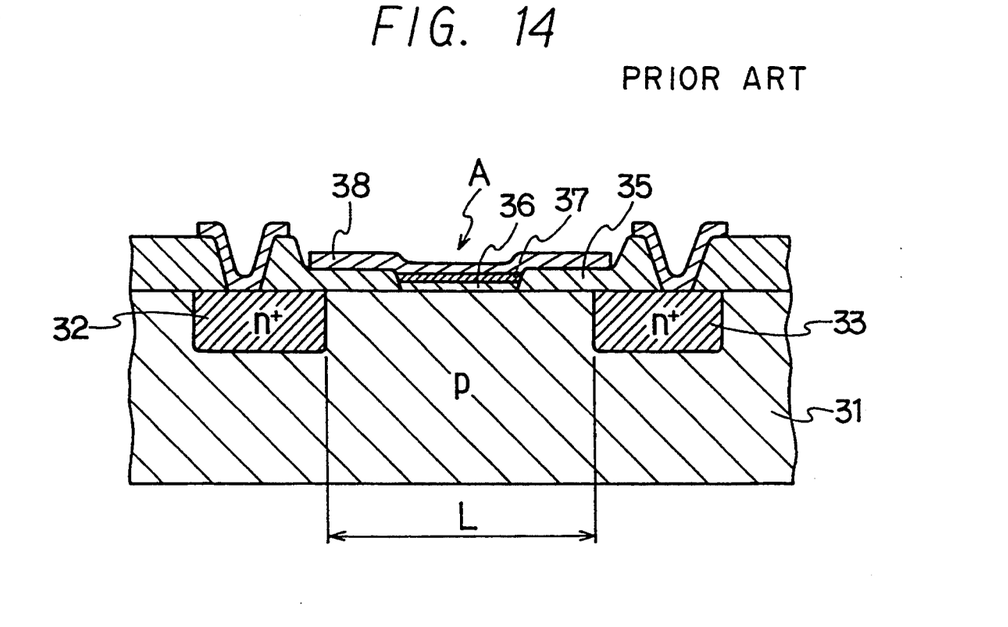
FIG. 14 is a fragmentary section showing a memory cell part of another conventional semiconductor memory device.

FIGS. 13 and 14 each illustrate an example of a MNOS type memory cell of such a composite type. In the structure of the example illustrated in FIG. 13, a n+-type source region 32 and n+-type drain region 33 are formed in, as a whole, a p-type semiconductor substrate 31. A central part of a thick oxide film 35 formed on the substrate 31 is removed by etching. In the removed portion there are sequentially formed a thin oxide film 36 for tunneling, a film 37, for example, made of silicon nitride for trapping carriers and a gate electrode film 38, for example, made of polysilicon. The thin part of oxide film A realizes a memory part by tunneling electrons, while portions adjacent thereto are utilized as a usual enhancement MOS transistor.

In the structure of the example illustrated in FIG. 14, a silicon nitride film 37 for trapping carriers is etched so as to be formed on a memory part A only. This structure is for avoiding such a problem attributable to the former structure that with a gate insulating film composed of the thick silicon oxide film and silicon nitride film in the MOS transistor coexisting with the memory part A, the threshold voltage would be largely changed due to a bias temperature (BT) treatment for this transistor.

In fabrication of the memory cell illustrated in FIG. 14, however, it is necessary to carry out patterning for each of the thin oxide film for tunneling, nitride film and gate electrodes while taking into consideration an margin for alignment for each patterning and the length of each film. In addition, the gate electrodes need to be patterned so as to be positioned on the narrow gate insulating films present on the opposite sides of the memory part A. As a result, the channel length L cannot be shortened to less than 3 μm. This leads to a limitation in scaling down a cell area and, hence, in increasing the integration density of devices.

SUMMER OF THE INVENTION

The present invention has been attained to solve the above-mentioned problems. Thus, it is an object of the present invention to provide a semiconductor storage wherein the area of a composite-type memory cell comprising a MONOS or MNOS type memory transistor and an usual MOS transistor is considerably reduced for increasing the integration density of devices, and a method for producing the same at a decreased cost.

According to the present invention, there is provided a semiconductor memory device having a plurality of memory transistors arranged in a matrix configuration, each of the memory transistors comprising a semiconductor substrate having a source region, a drain region and a channel region intermediate between the source and drain regions, a gate insulating film formed on one side of the channel region, a trap film formed on the other side of the channel region so as to join with the gate insulating film, and a gate electrode extending over the gate insulating film and the trap film.

In the present invention, the trap film has preferably a three-layered structure having including a silicon oxide film, a silicon nitride film and a silicon oxide film which are stacked in this order on the semiconductor substrate, for reliably retaining carriers.

Alternatively, it is also preferable from the view point of reducing fabrication steps that the trap film is of a double-layered structure having a silicon oxide film and a silicon nitride film which are stacked in this order on the semiconductor substrate.

Further, in view of the reliability of film formation for the gate electrode, it is preferable that the gate insulating film and the trap film are substantially coplanar with each other.

Yet, it is preferable from the view point of reducing fabrication steps that the trap film extends beyond the gate electrode onto the source or drain region.

Otherwise, it is preferable for eliminating influences of trapped carriers that the trap film is formed just under the gate electrode.

In addition, it is preferable to make the gate electrode to have a width of 0.1 to 1.0 μm in order to scale down the size of a cell for a higher integration and less production cost.

According to the present invention, there is also provided a method for producing a semiconductor memory device comprising steps of:
 (a) forming a field insulating film on a semiconductor substrate for isolating circuit elements;
 (b) forming a trap film on the semiconductor substrate for trapping carriers;
 (c) etching to partially remove the trap film on an active region interposed between the field insulating films so as to partially expose the active region of the semiconductor substrate;

(d) forming a gate insulating film on the exposed active region so as to join with the trap film;

(e) forming a gate electrode so as to extend over the trap film and the gate insulating film; and (f) implanting ions of an impurity into the active region with use of the gate electrode as a mask to form a source region and a drain region.

In the above method, from the viewpoint of eliminating influences of trapped carriers on the source or drain region, it is preferable to remove the trap film uncovered with the gate electrode by etching, form an insulating film on the active region which is exposed by that etching, and implant ion of the impurity into the active region with use of the gate electrode as a mask to form the source and the drain regions.

Further, from the viewpoint of improving the reliability of the trap film it is preferable that the trap film is formed by stacking a silicon oxide film, a silicon nitride film and a silicon oxide film in this order by a CVD technique.

In addition, it is preferable to form the gate insulating film by an oxidation method because the gate insulating film can readily be made to have a substantially coplanar relation with the trap film.

With the present invention, the gate insulating film and the trap film are provided so as to join with each other on the active region of the semiconductor substrate, and the gate electrode is formed to extend over the two films. This arrangement allows to fabricate a gate electrode to a lower limit size. Accordingly, a memory cell can be formed as having on a narrow channel region a memory part incorporating the trap film and a MOS transistor part incorporating the gate insulating film.

DETAILED DESCRIPTION

Figure 1:
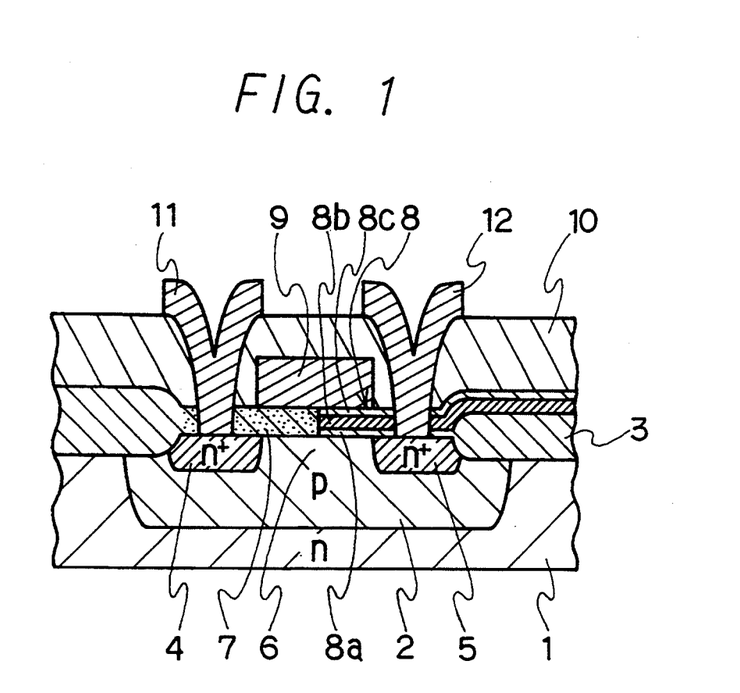
FIG. 1 is a fragmentary section showing a memory cell part of a semiconductor memory device as an embodiment of the present invention.

FIG. 1 illustrates in section the structure of a composite type memory cell of a semiconductor memory device as an embodiment of the present invention. Referring to FIG. 1, in a semiconductor substrate 1 of, for example, n-type is formed a p-type well 2, and h+-type source/drain regions 4 and 5 are formed in an active region surrounded by a field insulating film 3, for example made of silicon oxide for isolating each memory cell. On a channel region 6 which is interposed between the source/drain regions 4 and 5 are formed a gate insulating film 7, for example, made of silicon oxide and a trap film 8 which have substantially the same thickness and form as a whole a continuous layer. A gate electrode 9 is formed on the continuous layer so as to extend over the gate insulating film 7 and trap film 8. Further, the resulting substrate surface is covered with a protective film 10, for example, made of PSG in which contact holes are opened. On the protective film 10 is deposited a metal film, for example, made of Al—Si or Al—Si—Cu by vapor deposition method and the like to form source/drain electrodes 11 and 12 through the contact holes.

Figure 3:
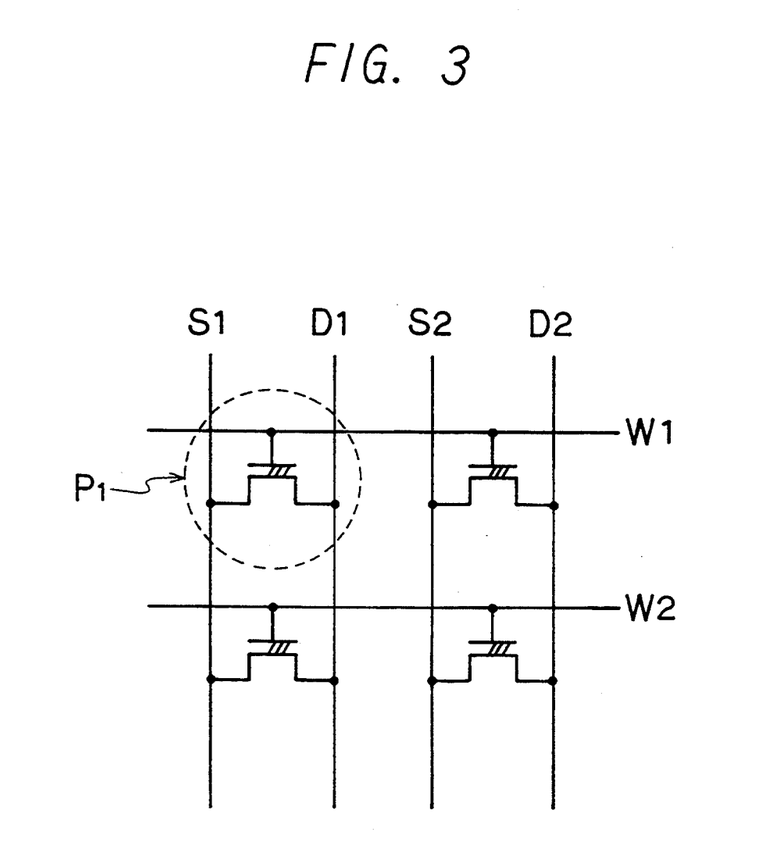
FIG. 3 an equivalent circuit diagram of a semiconductor memory device according to the present invention.

Memory cells of such a structure are arranged in a matrix configuration, wherein respective gate electrodes of memory cells, for example, in row are connected to each other to form a word line; respective drain electrodes of memory cells in column are connected to each other to form a bit line; and respective source electrodes of memory cells in column are connected to each other to form a source line. Thus, a semiconductor memory device having a circuit as shown in FIG. 3 and capable of allowing writing or reading is completed.

In the above embodiment, the trap film 8 has a three-layered structure comprising a tunnel insulating film 8$a$, an insulating film 8$b$ for retaining carrier and protective film 8$c$. The tunnel insulating film 8$a$ allows tunneling of carriers such as electrons to the insulating film 8$b$ for retaining carrier while preventing the carriers once injected into the carrier-retaining film 8$b$ from escaping. The tunnel insulating film 8$a$ is usually made of silicon oxide and has a thickness of 15 to 25 Å. The insulating film 8$b$ for retaining carrier serves to trap carriers such as electrons and is usually made of silicon nitride, silicon oxynitride, or the like, preferably silicon nitride. The thickness of the insulating film 8$b$ for retaining carrier is usually 30 to 500 Å. The protective film 8$c$, i.e. the top layer, serves to prevent trapped carriers from escaping into the gate electrode or the like, and is usually made of silicon oxide. The thickness thereof is usually 30 to 50 Å.

The trap film 8, however, has not necessarily such a three-layered structure, and can have a double-layered structure comprising the tunnel insulating film 8$a$ and carrier-retaining insulating film 8$b$ or of a single layer structure comprising the carrier-retraining insulating film 8$b$ only. In the above embodiment the gate insulating film 7 and trap film 8 are made to have substantially the same thickness. Although it is preferable, in view of the reliability, to make the gate insulating film 7 and trap film 8 to have substantially the same thickness for formation of a planarized gate electrode 9 thereon, they do not necessarily have substantially the same thickness.

According to the present invention, the gate insulating film 7 for an usual MOS transistor and the trap film 8 for memory are sidewardly continuously formed on the channel region of a MOS transistor, and the gate electrode 9 is formed as extending over the two films 7 and 8. Hence, there is no need to pattern the two film 7 and 8 separately, and only to be patterned is the gate electrode 9 so as to extend over the two films 7 and 8. Accordingly, a margin for alignment provided for patterning can be reduced to the lower limit. As a result, the width of the gate electrode 9 can be shortened to about 0.4 to about 1.0 $\mu$m. Moreover, the portion of the cell, in which the trap film 8 is present, operates as a usual memory transistor, while at the same time the portion thereof, in which the gate insulating film 7 is present, operates as a usual enhancement MOS transistor for preventing a faulty operation of the memory transistor such as to respond to a gate voltage lower than predetermined due to too much removal of electrons from the trap film 7. A sufficient channel length for each of the memory transistor and MOS transistor is abut 0.1 to about 0.2 μm; hence, the gate electrode can be formed to have a width of about 0.4 to about 1.0 μm. As a result, the size of a memory cell can be reduced to abut ⅓ relative to that of a conventional memory cell.

Although in the above embodiment the p-type well is formed in the n-type semiconductor substrate and the n-channel transistor in the p-type well, the conductive type of each component can be reversed. Besides, there can be directly formed in a semiconductor substrate of a conductive type a transistor having a channel of the opposite conductive type without forming a well. Further, although in the above embodiment the gate insulating film 7 is formed on the source side and the trap film on the drain side, this relation can be reversed.

Figure 2:
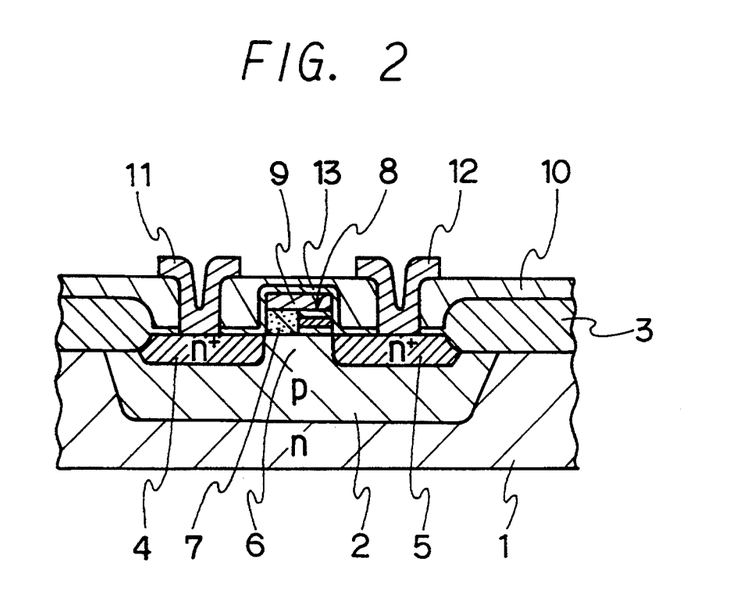
FIG. 2 is a fragmentary section showing a memory cell part of semiconductor memory device as another embodiment of the present invention.

In the structure of the above embodiment, the trap film 8 covers even the drain region 5. However, there will arise no problem because carriers injected into the trap film 8 being an insulating film can move little. If there is an apprehension that carriers trapped in the trap film 8 on source region or drain region would move and cause the conductance thereof to vary, the trap film 8 can be etched upon formation of the gate electrode 9 so as to remain only on the channel region 6, as shown in FIG. 2 wherein like numerals denote corresponding parts in FIG. 1. In this structure the trap film 8 is patterned so as to be aligned with the gate electrode 9, and a oxide film 13 is provided therearound. Thus, a semiconductor memory device in which memory cells of the structure shown in FIG. 2 are arranged in a matrix configuration as shown in FIG. 3 operates like the embodiment shown in FIG. 1.

To be described next is a method for producing semiconductor memory device according to the present invention.

Figure 4:
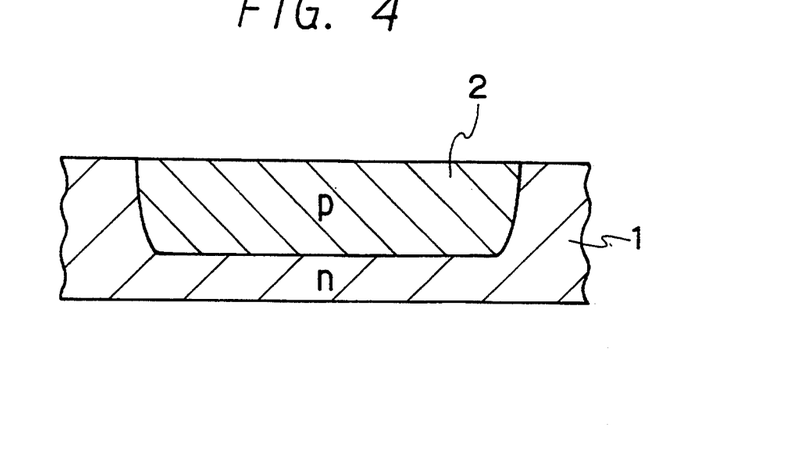
FIGS. 4 to 10 are each an explanatory sectional view for illustrating an example of a production process of the present invention.
Figure 5:
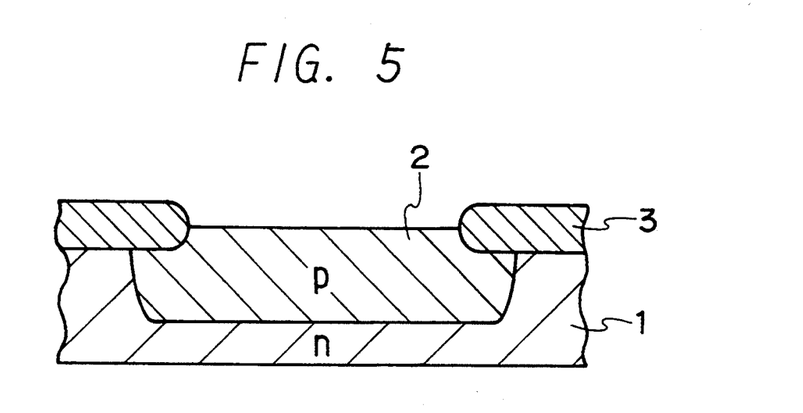

First, as shown in FIGS. 4 and 5, in a semiconductor substrate 1 is formed a well 2 of a first conductive type, p- or n-type, the first conductive type becoming the conductive type of a channel region to be defined later. Subsequently a 3000 to 7000 Å thick field insulating film 3, for example, made of silicon oxide is formed on the semiconductor substrate 1 by a selective oxidation technique so as to isolate memory cell regions from each other. Note that if the conductive type of the semiconductor substrate 1 is utilizable, the field insulating film 3 could be formed first without particularly forming the first conductive type well.

Figure 6:
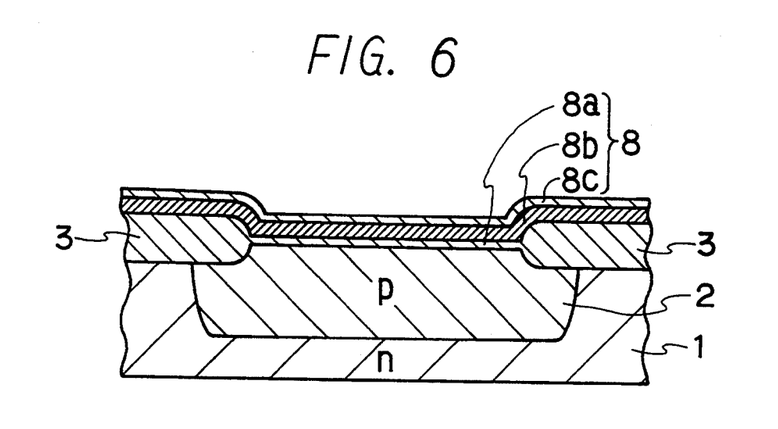

In turn, as shown in FIG. 6, a trap film 8 having a three-layered structure comprising a tunnel insulating film 8a, an insulating film 8b for retaining carrier and protective film 8c is formed. The tunnel insulating film 8a is composed of for example silicon oxide and formed as thin as about 15 to about 25 Å by for example an oxidation technique. On the tunnel insulating film 8a is formed the carrier-retaining insulating film 8b such as electrons. The carrier-retaining insulating film 8b is composed of silicon nitride or silicon oxynitride and deposited to about 50 to about 500 Å thick by a CVD technique or the like. On the film 8b is further formed the protective film 8c for preventing an upward flow of carriers. The protective film 8c is composed of silicon oxide or the like and formed to about 30 to about 50 Å thick by a CVD) technique, thermal oxidation technique or the like. Although it is preferable to form the trap film 8 of the three layered structure for effectively retaining injected carriers, the trap film 8 is not necessarily of the three-layered structure and might have a double-layered structure comprising the first layer 8a and second layer 8b or a single-layer structure comprising the second layer 8b only.

Figure 7:
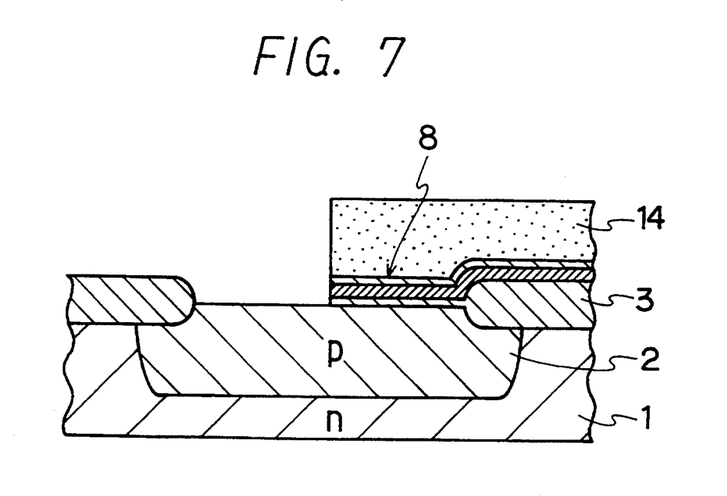

In turn, as shown in FIG. 7, the trap film 8 is patterned by etching at a center portion of a memory transistor to be formed, i.e., at about a mid-point of the active region surrounded by the field insulating film 3 to remove about a half of the trap film 8 on the active region. In this etching step, a protective film 14 composed of a resist film is formed on the trap film 8 to be retained, and there can be utilized a wet etching technique using phosphoric acid, hydrofluoric acid or the like, or a dry etching technique such as reactive ion etching (RIE), chemical dry etching (CDE) or the like.

Figure 8:
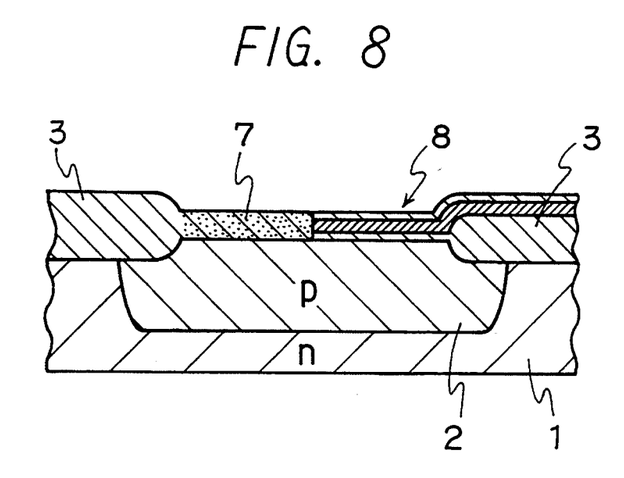

Subsequently, as shown in FIG. 8, on the active region from which the trap film 8 is removed, a gate insulating film 7 of silicon oxide or the like is formed by an oxidation technique, CVD technique or the like. In this case, it is preferable to employ a thermal oxidation technique because there is a difference in oxidation rate between the surface of the exposed active region and the oxide film 8c on the silicon nitride film 8b and, hence, the gate insulating film 7 and the trap film 8 can made substantially coplanar with each other. However, the films 7 and 8 do not necessarily need to be coplanar with each other.

Figure 9:
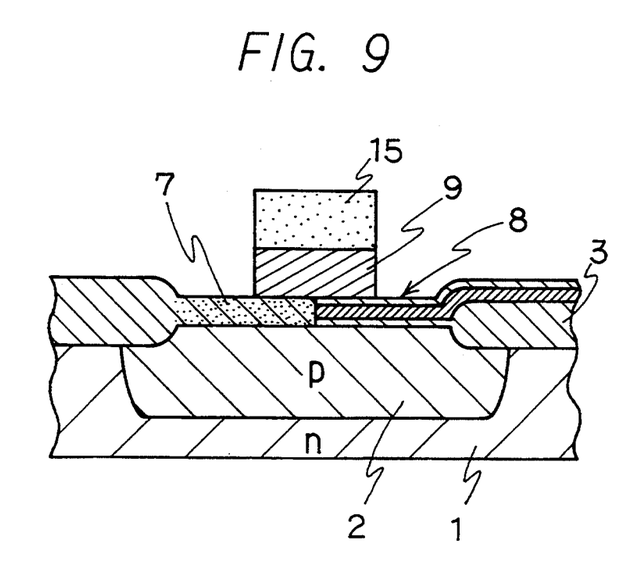

Next, as shown in FIG. 9, a gate electrode 9 is formed so as to extend over the gate insulating film 7 and the trap film 8. In the formation of such a gate electrode, firstly, a film, for example, made of polysilicon containing an impurity, silicide or polycide is deposited to about 3000 to about 4000 Å thick on the surface of both the gate insulating film 7 and the trap film 8 by a CVD technique, sputtering technique and the like technique. Then, a protective film 15 formed of a resist film is applied and patterned so as to extend over the gate insulating film 7 and the trap film 8. Subsequently the film on both the films 7 and 8 is etched by a wet etching using a HF—HNO$_3$ type etching agent or a dry etching such as reactive ion etching or chemical dry etching thereby defining the gate electrode 9. If the protective film 15 is patterned on the basis of a mask used for the protective film 14, it can be retained as extending over the gate insulating film 7 and the trap film 8 while the junction of these films 7 and 8 assumes the center of the resulting protective film 15, with an alignment margin of less than 0.1 μm.

Figure 10:
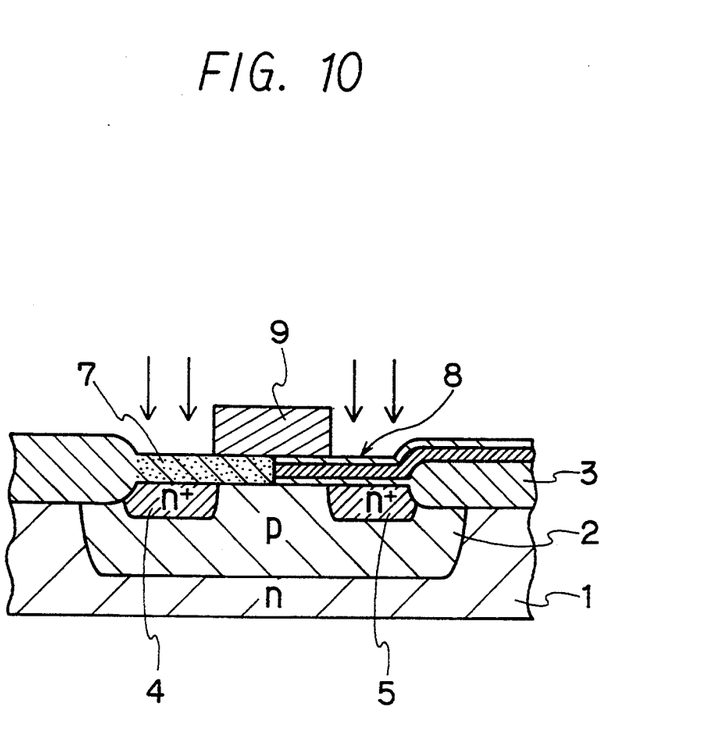

In turn, ions of an impurity are implanted into the active region with use of the gate electrode as a mask to form source/drain regions 4 and 5. Examples of the impurities include phosphorus, arsenic and antimony as n-type impurities and boron and aluminum as p-type impurities. Usually this ion implantation is carried out at an acceleration energy of 50 to 100 keV and a dose of 5E14 to 5E15/cm$^2$, though such conditions depend on the kind of impurities or the like.

Finally, the surface of the resulting structure is entirely covered with an interlayer insulating film 10, for example, made of silicon oxide, PSG and BPSG which is then removed to form contact holes. Then, provided is an electrode film, example, made of Al—Si, Al—Si—Cu, W, WSi or polysilicon to form a source electrode 11 and drain electrode 12. Thus, a memory cell as shown in FIG. 1 is completed. Then, a metal interconnection film, for example, made of aluminum, Al—Si, Al—Si—Cu, W, WSi or polysilicon is deposited and patterned by etching to form a word line connecting respective gate electrodes of memory transistors thus formed, a source line connecting respective source electrodes thereof, and a bit line connecting respective drain electrodes thereof.

Figure 11:
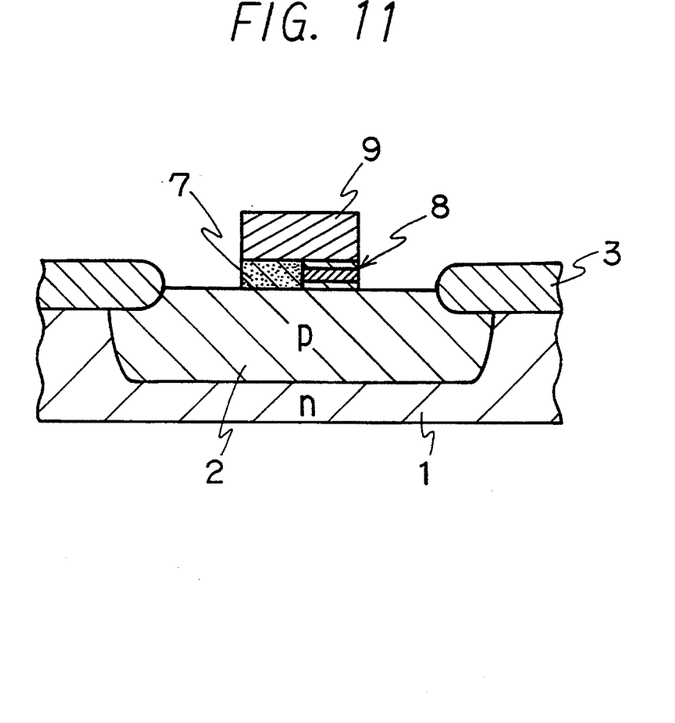
FIGS. 11 and 12 are each an explanatory sectional view illustration another example of a production process of the present invention.
Figure 12:
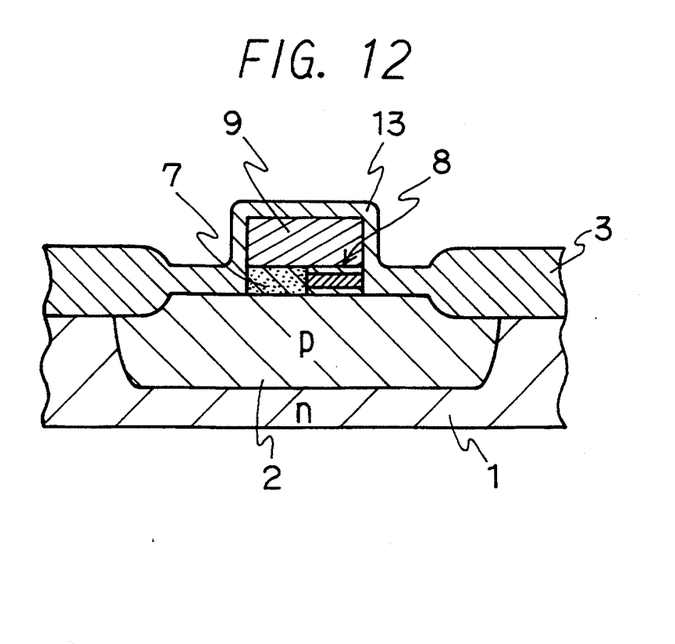

In the above process, the trap film 8 is retained even on the drain region 5. However, if it is to be removed from the drain region 5, after the formation of the gate electrode 9 as shown in FIG. 9 the trap film 8 on the drain region 5 is removed by etching as used in the step of FIG. 7 with use of the gate electrode 9 as a mask. Thus, the structure as shown in FIG. 11 can be obtained. Thereafter, as shown in FIG. 12, the structure is covered with an insulating film 13 of silicon oxide by a CVD technique, thermal oxidation technique or a like technique. Then, the procedure associated with FIG. 10 follows. Thus, a semiconductor memory device is completed.

Next, the preferred embodiments of the present invention are described in more detail.

EXAMPLE 1

First, a silicon substrate 1 having a cube face of (100) of 2 to 5 $\Omega$.cm resistivity was subjected to implantation of boron ion at an acceleration energy of about 100 keV and a dose of about $2E13/cm^2$, then heat-treated in a nitrogen atmosphere at about $1150\pm5°$ C. for about eight hours, to form a p-type well 2 (refer to FIG. 4).

Subsequently, on the substrate surface were deposited a pad silicon oxide film having a thickness of about 500 Å and a silicon nitride film having a thickness of about 1500 Å by a CVD technique. The silicon nitride film was then etched with an active region masked with a resist film, followed by heat treatment at about 900 to about 1000° C. for about 150 minutes to form a field oxide film 3 having a thickness of about 7000 Å. Thereafter, the retained silicon nitride was peeled off by etching with hot phosphoric acid, followed by etching with hydrofluoric acid to remove the thin silicon oxide on the active region (refer to FIG. 5).

Next, a trap film 8 was formed by depositing on the entire substrate surface a about 20 Å-thick silicon oxide film, about 200 Å-thick silicon nitride film and about 50 Å-thick silicon oxide film sequentially by a CVD technique (refer to FIG. 6).

In turn, a photoresist film 14 having a thickness of about 1 μm was applied to the substrate surface, then patterned to be cut out at about the mid-point of the active region surrounded by the field oxide film 3. Then, the trap film 8 of the three-layered structure was etched with hydrofluoric acid to expose a portion of the silicon substrate 1 (refer to FIG. 7).

Subsequently, the surface of the exposed silicon substrate was oxidized by a heat treatment at about 850 to about 900° C. for about 60 minutes to form a gate insulating film 7 of silicon oxide having a thickness of about 300 Å. Although the trap film 8 was also oxidized, the silicon nitride film 8b served to inhibit oxidation of the overlying silicon oxide film 8c. Accordingly, the oxidation rate of the silicon oxide film 8c was too small to thicken the film 8c. As a result, the top face of the resulting gate insulating film 7 was substantially coplanar with that of the trap film 8 (refer to FIG. 8).

In turn, a polysilicon film was deposited to about 4000 Å thick over the entire surface of the resulting structure by a CVD technique. In this case, phosphine gas was admixed at a rate of 10% by volume with the source gas for CVD) so that the resulting polysilicon film would be doped with a n-type impurity (phosphorus) to have a higher conductivity. Thereafter, the polysilicon film was etched by a RIE technique while masked with a photoresist film 15, to define a gate electrode 9 (refer to FIG. 9). In this case, the mask for patterning the photoresist film 15 was positioned so that the center line of the photoresist film which would result from this patterning would be aligned with the boundary line of gate insulating film 7 and trap film 8.

Then, arsenic ions were implanted at an acceleration energy of about 70 keV and a dose of about $5E15/cm^2$ to form a n+type source region 4 and n+type drain region 5 simultaneously (refer to FIG. 10).

Finally, an interlayer insulating film 10 of BPSG was deposited to about 6000 Å thick by a CVD technique, followed by annealing in a nitrogen atmosphere at about 900° C. for about 30 minutes. Then, contact holes were formed in the interlayer insulating film 10 by patterning a photoresist film and etching according to a RIE technique, followed by vapor deposition of an Al—Si film which was then patterned to form a source electrode 11 and drain electrode 12 (refer to FIG. 1). Further, an aluminum interconnection film was deposited and patterned to form a word line, source line and bit line.

EXAMPLE 2

To be described next is a second example of the method of the present invention wherein a trap film is formed just under a gate electrode.

First, the steps as illustrated in FIGS. 4 to 9 were carried out in the same manner as in EXAMPLE 1. Then, as shown in FIG. 11, the films 8c, 8b and 8a forming the trap film 8 were sequentially etched by RIE in self-alignment with the gate electrode 9 thereby exposing a portion of the silicon substrate surface.

Thereafter, as shown in FIG. 12, the resulting structure was subjected to a heat treatment at 850° to 900° C. for about 60 minutes to form a silicon oxide film having a thickness of about 500 Å and covering the exposed portion of silicon substrate surface and gate electrode 9. Subsequently the steps associated with FIG. 10 and thereafter were carried out in the same manner as in EXAMPLE 1. Thus, a semiconductor memory device as shown in FIG. 2 was obtained.

To be described next is how to write, erase and read with respect to a memory cell $P_1$ in a semiconductor memory device wherein memory transistors of the structure described above are arranged in a matrix configuration as shown in FIG. 3.

When a data is to be written in the cell $P_1$, a voltage of 10 V is applied to a word line $W_1$, and a write-inhibiting voltage of 7 V to bit lines $D_2$ to $D_n$, while the other word lines $W_2$ to $W_n$, bit line $D_1$ and substrate are made to be 0 V, and source lines $S_1$ to $S_n$ are opened. Thus, the cell $P_1$ is applied with a voltage of 10 V between its gate electrode and drain, and electrons tunnels through the tunnel oxide film to the trap film because of the tunnel effect and retained therein. Thus, writing is accomplished. Since the other transistors in the row to which the cell $P_1$ belongs are each applied with a potential of 7 V to the drain, the voltage across the gate and drain of each of the transistors assumes 3 V. Such a low voltage will not allow tunneling of electrons and, hence, writing in the other transistors is never effected. Consequently writing is accomplished only in the cell $P_1$.

When a data in the cell $P_1$ is to be erased, a voltage of $-10$ V is applied to the word line $W_1$, while the other word lines $W_2$ to $W_n$ and substrate are made to assume 0 V, and the bit lines $D_1$ to $D_n$ and source lines $S_1$ to $S_n$ are opened. As a result, in each of the memory transistors in the row to which the cell $P_1$ belongs the gate assumes $-10$ V with respect to the substrate and, hence, electrons retained in the trap film are removed therefrom toward the substrate. Thus, erasing is accomplished. In this erasing all the cells in the row to which the cell $P_1$ belongs are subjected to erasing. Accordingly, erasing is effected on a word line basis, and the memory transistors in the other rows assumes 0 V at their gates and, hence, will never be erased.

When a data in the cell $P_1$ is to be read, a voltage of 5 V is applied to the word line $W_1$, and 2 V to the bit line $D_1$, while the other word lines $W_2$ to $W_n$, source line $S_1$ and substrate are made to assume 0 V, and the other bit lines $D_2$ to $D_n$ and the other source lines $S_2$ to $S_n$ are opened. Thus, each of the memory transistors in the column to which the cell $P_1$ belongs is applied with a voltage of 2 V between the drain and source and, hence, ready to permit a flow of current depending on the gate voltage. In this case, since only the cell $P_1$ is applied with a voltage of 5 V at the gate thereof while the other memory transistors assume 0 V at the respective gates, only the cell $P_1$ is turned ON or OFF depending on whether it is written or not. Specifically speaking, if the cell $P_1$ is in a written state, i.e., the trap film thereof has been injected with electrons, the threshold voltage thereof is high and, hence, the cell $P_1$ is in OFF state with respect to a voltage of 5 V. In contrast, if the trap film is not injected with electrons, current flows between the drain and source and, hence, the cell $P_1$ is turned ON. As a result, a data "1" or "0" can be read. Although the other memory transistors in the row to which the cell $P_1$ belongs are each applied with 5 V at the gate thereof, they remain in OFF state because the respective sources and drains are opened. It should be understood that even if too many electrons are removed from the other memory transistors in the column to which the cell $P_1$ belongs so that those transistors become responsive even to 0 V because of a decrease in threshold voltage, the MOS transistor coexisting in the cell $P_1$ would never be turned ON and, hence, there would be no erroneous reading.

The above operation method is summarized in the following Table 1.

TABLE 1

|  | $W_1$ | $W_2$ | $D_1$ | $D_2$ | $S_1$ | $S_2$ | SUBSTRATE |
| --- | --- | --- | --- | --- | --- | --- | --- |
| WRITE (V) | 10 | 0 | 0 | 7 | OPEN | OPEN | 0 |
| ERASE (V) | −10 | 0 | OPEN | OPEN | OPEN | OPEN | 0 |
| READ (V) | 5 | 0 | 2 | OPEN | 0 | OPEN | 0 |

In the above operation method, an electron serves as a carrier. However, inversing the positive or negative of each of the potential makes a positive hole to serve as a carrier to obtain the same effect.

As has been described, according to the present invention a memory cell is formed wherein a gate insulating film and a trap film for trapping carriers are joinedly formed on a semiconductor substrate; a gate electrode is formed so as to extend over the two films; and source/drain region is formed on opposite sides of the gate electrode. Hence, there can be formed within a small cell area a memory part for trapping carriers and an usual enhancement MOS transistor with a gate electrode sized to the lower fabrication limit. Consequently, a semiconductor memory device with a higher integration can be produced at a reduced cost.

Though several embodiments of the present invention are described above, it is to be understood that the present invention is not limited only to the above-mentioned embodiment, various changes and modifications may be made in the invention without departing from the spirit and scope thereof.

What is claimed is:

1. A semiconductor memory device having a plurality of memory transistors arranged in a matrix configuration, each of the memory transistors comprising
    a semiconductor substrate having a source region, a drain region and a channel region intermediate between the source and drain regions; a gate insulating film formed on one side of the channel region;
    a trap film formed on the other side of the channel region so as to join with the gate insulating film, said trap film comprises an insulating material; and
    a gate electrode formed only in the channel region and extending over the gate insulating film and the trap film.

2. The semiconductor memory device as set forth in claim 1, wherein said trap film has of a three-layered structure including a silicon oxide film, a silicon nitride film and a silicon oxide film which are stacked in this order on said semiconductor substrate.

3. The semiconductor memory device as set forth in claim 1, wherein said trap film is of a double-layered structure having a silicon oxide film and a silicon nitride film which are stacked in this order on said semiconductor substrate.

4. The semiconductor memory device at set forth in claim 1, wherein said gate insulating film and said trap film are substantially coplanar with each other.

5. The semiconductor memory device as set forth in claim 1, wherein said trap film extends beyond said gate electrode onto the source or drain region.

6. The semiconductor memory device as set forth in claim 1, wherein said trap film is formed just under said gate electrode.

7. The semiconductor memory device as set forth in claim 1, wherein said gate electrode has a width of 0.4 to 1.0 μm.

* * * * *